(12) United States Patent
Scholte van Mast

(10) Patent No.: US 7,067,399 B2
(45) Date of Patent: Jun. 27, 2006

(54) METHOD AND APPARATUS FOR REMOVAL OF SURFACE CONTAMINANTS FROM SUBSTRATES IN VACUUM APPLICATIONS

(75) Inventor: Bart Scholte van Mast, Azmoos (CH)

(73) Assignee: Applied Materials, Inc., Santa Clara, CA (US)

( * ) Notice: Subject to any disclaimer, the term of this patent is extended or adjusted under 35 U.S.C. 154(b) by 343 days.

(21) Appl. No.: 10/424,197

(22) Filed: Apr. 25, 2003

(65) Prior Publication Data

US 2003/0200985 A1    Oct. 30, 2003

Related U.S. Application Data

(62) Division of application No. 09/764,195, filed on Jan. 16, 2001, now Pat. No. 6,554,950.

(51) Int. Cl.
*H01L 21/322*    (2006.01)

(52) U.S. Cl. ....................... 438/473; 438/795

(58) Field of Classification Search ............... 438/473, 438/474, 475, 795, 798, 905, 906, 974
See application file for complete search history.

(56) References Cited

U.S. PATENT DOCUMENTS

| | | |
|---|---|---|
| 5,350,480 A | 9/1994 | Gray |
| 5,352,330 A | 10/1994 | Wallace |
| 5,516,369 A | 5/1996 | Lur et al. |
| 5,554,257 A | 9/1996 | Yokogawa et al. |

(Continued)

FOREIGN PATENT DOCUMENTS

| | | |
|---|---|---|
| EP | 0 400 651 A2 | 12/1990 |
| FR | 2 793 264 A1 | 11/2000 |
| WO | WO 00/22661 A1 | 4/2000 |
| WO | WO 00/75974 A1 | 12/2000 |

OTHER PUBLICATIONS

Colera, I., et al., "Electron stimulated desorption study of the MgO(1000)-$D_2O$ system," *J. Vac. Sci. Technol.* A, 15(3), May/Jun. 1997, pp. 1698-1703.

Watanabe, Fumio, et al., "Separation of electron-stimulated-desorption neutrals from outgassing originating from the grid surface of emission-controlled gauges: Studies with a heated-grid gauge," *J. Vac. Sci. Technol. A*, 17(6), Nov./Dec. 1999, pp. 3467-3472.

(Continued)

*Primary Examiner*—Tuan H. Nguyen
(74) *Attorney, Agent, or Firm*—Sughrue Mion LLP

(57) ABSTRACT

A method and apparatus for removal of volatile contaminants from substrate surfaces before the substrate enters a process chamber. Substrate cleaning is achieved by irradiating the substrate with a low-energy electron beam. The interaction of the electrons in the beam with the contaminants present on the surface of the substrate causes evaporation of low vapor pressure species which can be deposited on the surface. A cryoshield pumps the evaporated species. After evaporation and pumping, the substrate passes through a glow discharge chamber wherein the negative surface charge created by the electron beam is neutralized using positive ions. The inventive apparatus can be configured so that no separate vacuum chamber is needed to prepare the substrate.

2 Claims, 1 Drawing Sheet

U.S. PATENT DOCUMENTS

| | | |
|---|---|---|
| 5,796,111 A | 8/1998 | Mahoney |
| 6,201,219 B1 | 3/2001 | Sandhu et al. |
| 6,256,825 B1 | 7/2001 | Hwang |
| 6,277,767 B1 | 8/2001 | Shiramizu et al. |

OTHER PUBLICATIONS

Hayama, A., et al., (Desorption of metastable particles induced by electronic excitation at the surface of rare-gas solid with physisorbed hydrogen, *J. Vac. Sci. Technol. A*, 16(3), May/Jun. 1998, pp. 979-983.

Gomez-Goni, J., et al., "Temperature dependence of the electron induced gas desorption yields on stainless steel, copper, and aluminum," *J. Vac. Sci. Technol. A*, 15(6), Nov./Dec. 1997, pp. 3093-3103.

*Patent Abstracts of Japan*, vol. 18, No. 528 (C-1258) Oct. 6, 1994 (JP 06 183893 A).

*Patent Abstracts of Japan*, vol. 1998, No. 05, Apr. 30, 1998 (JP 10 008277 A).

METHOD AND APPARATUS FOR REMOVAL OF SURFACE CONTAMINANTS FROM SUBSTRATES IN VACUUM APPLICATIONS

This is a divisional of application Ser. No. 09/764,195 filed Jan. 16, 2001; the disclosure of which is incorporated herein by reference now U.S. Pat. No. 6,554,950.

BACKGROUND OF THE INVENTION

1. Field of the Invention

This invention generally relates to techniques for removal of volatile contaminants from substrate surfaces before the substrates are placed into a vacuum process chamber. In particular, the invention relates to techniques for cleaning semiconductor wafers, as well as other articles used in manufacturing of semiconductor devices using a charged particle beam, such as an electron beam.

2. Description of the Related Art

Modern microelectronic devices such as microprocessors and memory chips are manufactured by creating multiple layers of various materials on the top surface of a silicon wafer. For instance, semiconductor device fabrication can involve creating a silicon oxide layer on the surface of the wafer, and creating interconnecting wires by depositing a metal layer having a predefined microscopic pattern on the top surface of the wafer.

If the surface of the semiconductor wafer has various contaminants, such as volatiles, water, or oxygen molecules, the semiconductor devices manufactured using such a wafer may be defective. Contamination of the wafer surfaces is a major cause of reduced process yields in device manufacture. Therefore, as will be appreciated by those of working skill in the art, during manufacture of semiconductor devices it is desirable to keep the surfaces of the semiconductor wafers free of any contaminants.

A major cause of the aforementioned wafer surface contamination is electromagnetic interaction between the atoms and molecules of the contaminant and the atoms of the material (e.g. silicon, or silicon oxide) forming the top atomic layers of the wafer. Such electromagnetic interaction results in an attractive force between the contaminant atoms/molecules and the wafer atoms/molecules, thus keeping the contaminants attached to the surface of the wafer.

Various contaminants come from different sources. Some of the most common contaminant species include fluoride ($F^-$) ions, which originate generally in the vacuum system. Hydrogen ($H^+$) contamination comes from the residual vacuum as well as from the $H^+$ contamination of the wafer during its preparation. This type of contamination can be hard to remove. Other contaminants include $O^+$, $H_2O$, and various hydrocarbons, which come primarily from the ambient atmosphere.

One conventional way of removing the contaminants from surfaces of substrates is heat treatment. According to one such method, the surface of the substrate is illuminated with a powerful beam of electromagnetic radiation, from a lamp or similar device. The irradiation of the substrate surface causes heating of the surface. The heating, in turn, increases the thermal energy of the surface and the contaminants attached thereto, whereby the contaminants leave the surface when their thermal energy exceeds the size of the potential barrier created by the aforementioned attractive force. Typically, for effective removal of the contaminants, the surface of the substrate needs to be heated to temperatures of 200–300° C. or higher, depending on the nature of the contaminants and the chemical composition of the substrate's surface layer.

As also will be appreciated by those of working skill in the art, any unnecessary heating of the surface of a semiconductor wafer is undesirable. In particular, heating a silicon wafer may cause permanent damage to the crystalline structure thereof, change profiles of dopant levels, for example, or release contaminants embedded in the body of the wafer and its internal structures.

Accordingly, there is a need for, and it would be advantageous to have an improved substrate surface cleaning method and apparatus, which would provide efficient surface cleaning without substantial heating of the substrate's surface.

SUMMARY OF THE INVENTION

Accordingly, it is one feature of the present invention to overcome the aforementioned deficiency of conventional techniques and to provide a method and apparatus for efficient cleaning of substrates, without substantial heating of the substrate surface.

In accordance with the present invention, there is provided an apparatus for removing contaminants from the surface of a substrate using a particle beam. The inventive apparatus comprises a linear particle source capable of producing particles of a predetermined kinetic energy, the particle beam inducing the desorption of contaminants from the surface of the substrate. The apparatus also comprises a cryoshield having a condensation region for pumping the desorbed contaminants. The particles used in the cleaning can be electrons, photons, or ions. The cryoshield of the inventive apparatus may optionally include a pre-pumping region for pre-pumping the substrate before its irradiation.

Optionally, the cryoshield may further comprise a charge neutralization region, wherein charges created on the surface of the substrate are neutralized by ions, such as $Ar^+$ ions.

Another aspect of the invention is a method for substrate cleaning using particle beams. According to the inventive method, the substrate is irradiated with a particle beam, which induces the desorption of contaminants from the surface thereof. The inventive cleaning method may optionally include pre-pumping of the substrate and charge neutralization following the irradiation. In the inventive method the substrate may be moved continuously with respect to the cleaning apparatus so that cleaning is performed continuously.

BRIEF DESCRIPTION OF THE DRAWINGS

The foregoing and other objects, features, and benefits of the invention will be appreciated in the light of the following detailed description of a preferred embodiment thereof, given by way of example only with reference to the accompanying drawing, in which.

DETAILED DESCRIPTION OF A PREFERRED EMBODIMENT

Figure 1:
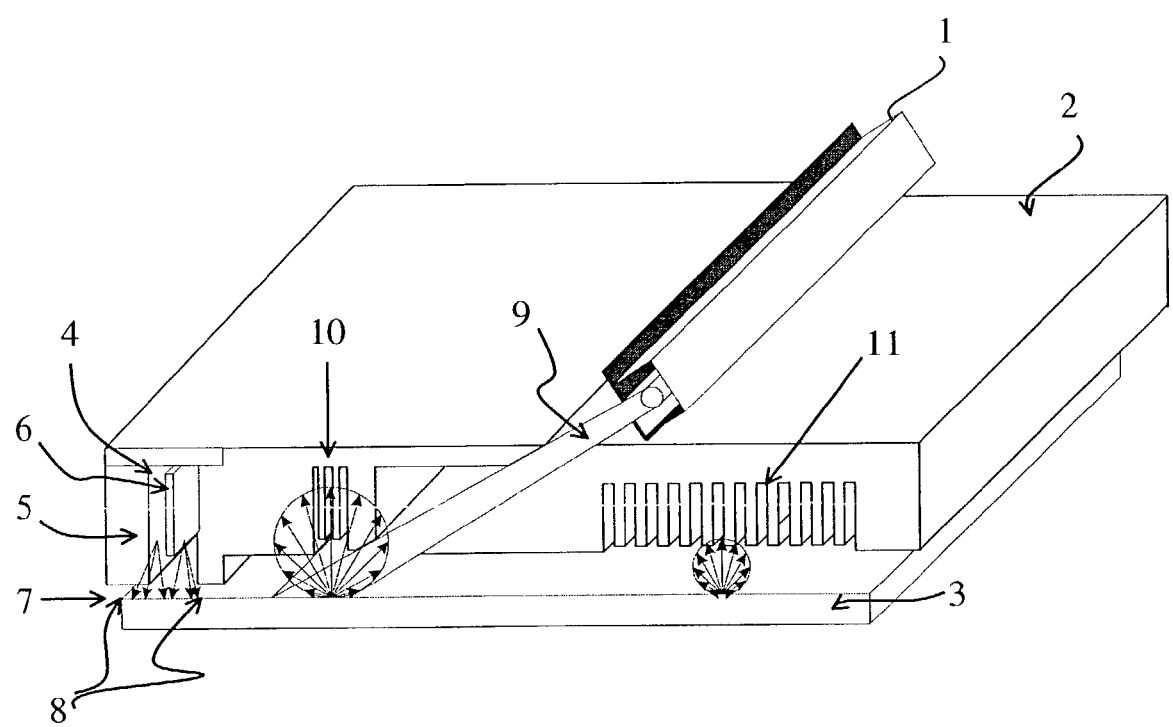
FIG. 1 is a diagram of the inventive apparatus.

The inventive substrate cleaning technique differs from the aforementioned conventional lamp-based cleaning methods in that the invention utilizes low energy charged particles, such as electrons, to stimulate desorption of low vapor pressure contaminants attached to the surface of the substrate. The use of an electron beam allows this stimulation to be performed in a well-controlled manner.

It has been observed that the irradiation of a surface of a substrate with beams of electrons, photons, or ions induces the desorption of various species. As is known, particle induced desorption is the emission of contaminants from the surface of the substrate induced by the irradiating particle beam. The desorption phenomenon is also known as beam cleaning because it involves the depletion of gas from the uppermost layers of the substrate.

The desorption is caused by initial electronic excitation of the contaminant species or an atom of the substrate and a subsequent transformation of the excitation energy of a desorbed atom or molecule to kinetic energy. Having acquired this kinetic energy, the atom or molecule of the contaminant overcomes the potential barrier created by the attraction forces acting between the surface and the atom or molecule and leaves the surface. Because the kinetic energy of the desorbed atom originates in the excitation energy, this phenomenon is known as desorption induced by electronic transitions.

It has been observed that the desorption yield depends on the energy of the electrons irradiating the surface of the substrate, the desorption yield being the number of desorbed atoms or molecules per incident electron. In particular, almost no desorption occurs when the kinetic energy of the irradiating electrons is below a predetermined threshold energy. This threshold energy varies with the type of the contaminant species and the material of the substrate. As is known to persons of ordinary skill in the art, the interaction force between the atoms of a substrate and atoms or molecules of the contaminant is determined by the nature of the aforementioned particles. The magnitude of the interaction force, in turn, determines the size of the potential barrier and the aforementioned threshold energy needed to overcome it.

Experiments have shown that the desorption threshold energies vary for various contaminants and substrate materials in the range from tens of eV to about one hundred eV.

In addition, it has been observed that the desorption yield generally increases with the increase of the electron energy. Accordingly, it is desirable to maintain the electron energy substantially above the aforementioned desorption threshold energy to maintain a higher desorption yield. Those of ordinary skill in the art will appreciate that higher electron energies result in a lower energy transfer yield to surface films. In addition, the electron energy can be optimized to minimize charge build-up at the surface of the substrate.

However, it should be noted that the electrons with energies above 300 eV can produce x-rays which can cause desorption of gases from the walls of the apparatus and the vacuum chamber. This may result in additional contamination of the chamber and the substrate. Accordingly, the energy of the irradiating electron beam should be selected so as to achieve a compromise between the aforementioned effects. It also should be noted that the contaminant ions leaving the surface of the substrate typically have kinetic energies ranging between a few eV and tens of eV.

The current of the irradiating electron beam should be maintained at such value as to provide for accumulation of a sufficient irradiation dose to cause the desorption of a significant amount of gas. For instance, the current can be in the range between $10^{-5}$A and $10^{-3}$A.

It also should be noted that photoelectrons are believed to be responsible for the photon-induced gas desorption. This explains the observation that the electron and photon induced gas desorption yields are related. It has been shown that the photon-induced gas desorption yields increase with the increase of the temperature. On the other hand, it also has been observed that the desorption yields do not change substantially for $H_2$, $CH_4$, CO, and $CO_2$ at room temperature and at 200° C.

Accordingly, because the electron-induced desorption causes the depletion of the layer of gas molecules or other microscopic contaminant particles attached to the surface of the article, that desorption can be used for cleaning not only the surface of semiconductor substrate wafers but also the surfaces of other articles used in fabrication of semiconductor devices before these articles enter a process chamber. The inventive apparatus uses an electron beam to induce desorption of gases from the surface of the substrate, and a differential pumping chamber to evacuate the desorbed species.

A schematic layout of the inventive substrate cleaning apparatus is shown in FIG. 1. An irradiating electron beam 9 is produced in the inventive substrate cleaning apparatus by a linear electron source 1. Preferably, the electron source 1 should be at least as long as the entire width of a substrate 3, so as to enable cleaning of the substrate 3 in a single pass. If a source of a smaller width is utilized, two or more cleaning passes may be performed.

As shown in FIG. 1, the electrons in the beam 9 produced by the electron source 1 are directed towards substrate 3 through a slit in a specially formed cryoshield 2. The cryoshield 2 preferably is shaped to maximize pumping speed of the evaporated species, but other design requirements of course could dictate a different shape, taking other considerations into account. The shield also houses a small glow discharge chamber forming a neutralization zone 4 for neutralizing the charge formed on the surface of the substrate as a result of the effect of the electron beam. Separation between evaporation region 10 and glow discharge region 4 is formed by a set of two differential pumping slits 8, with the substrate 3 acting as a sidewall.

The substrate 3 entering the cleaning device is pre-pumped in a pre-pumping region 11 of the cryoshield 2, using non-stimulated evaporation into the cryoshield 2. The substrate subsequently is irradiated by the electron beam 9, which actively evaporates low vapor pressure contaminant species. The evaporation region 10 of the cryoshield 2 pumps these species. The substrate 3 then enters the glow discharge region 4 having an electrode 6 through a differential pumping slit 8. Negative surface charges, produced by the interaction of the electrons irradiating the specimen with the surface of the substrate, are neutralized in the glow discharge region 4 by the arrival of positive ions such as $Ar^+$ from plasma 5 contained therein.

The inventive substrate cleaning device can be utilized in the substrate handling areas of vacuum equipment. One place for such a device would be directly after the entrance load lock of the equipment, between a gate valve and a transfer chamber. The movement of the substrate is then provided by the transfer mechanism of any known design.

While the invention has been described herein with reference to preferred embodiments thereof, those of ordinary skill in the art will appreciate that various modifications in form and detail may be made therein without departing from the scope and spirit of the invention, as defined in and by the appended claims. For example, the apparatus is not limited to cleaning the articles used in semiconductor device manufacturing. The apparatus can be used in cleaning surfaces of any substrates.

Additionally, it should be noted that some types of surface contamination, such as the carbon contamination, can be removed most efficiently by sputtering the surface of the substrate with various ions, such as $Ar^+$ ions, with kinetic energy of several hundred eV, preferably 500 eV. Accordingly, the disclosed apparatus for removing the contaminants can be modified to use an ion beam of a suitable energy in place of the electron beam.

Also, as mentioned above, because photons can be used to produce photoelectrons, the photon and electron-induced desorptions are closely related. Accordingly, a beam of photons can also be used for article irradiation in a manner described above.

What is claimed is:

1. A method for removing contaminants from a surface of an article, said method comprising:

(a) irradiating said surface with a particle beam comprising a photon beam to induce desorption of said contaminants without substantial heating of the surface; and (b) pumping said desorbed contaminants away from said surface.

2. The method of claim 1, wherein said article is a semiconductor wafer.

* * * * *